(12) United States Patent
Song et al.

(10) Patent No.: US 7,482,639 B2
(45) Date of Patent: Jan. 27, 2009

(54) NITRIDE-BASED LIGHT-EMITTING DEVICE

(75) Inventors: June-o Song, Gwangju-si (KR);
Tae-yeon Seong, Gwangju-si (KR)

(73) Assignees: Samsung Electronics Co., Ltd.,
Suwon-Si, Gyeonggi-Do (KR);
Gwangju Institute of Science and Technology, Buk-Gu, Gwangju-Si (KR)

( * ) Notice: Subject to any disclaimer, the term of this patent is extended or adjusted under 35 U.S.C. 154(b) by 0 days.

(21) Appl. No.: 10/984,855

(22) Filed: Nov. 10, 2004

(65) Prior Publication Data

US 2005/0104077 A1 May 19, 2005

(30) Foreign Application Priority Data

Nov. 14, 2003 (KR) .................. 10-2003-0080719

(51) Int. Cl.
*H01L 33/00* (2006.01)
(52) U.S. Cl. .................. 257/99; 257/103; 257/E33.062
(58) Field of Classification Search .................. 257/96, 257/98, 99, 101–103, 94, E33.062, E33.064
See application file for complete search history.

(56) References Cited

U.S. PATENT DOCUMENTS

| 6,593,597 | B2 * | 7/2003 | Sheu .................. 257/94 |
| 7,045,820 | B2 * | 5/2006 | Hayashi et al. .................. 257/79 |
| 2002/0123164 | A1 | 9/2002 | Slater, Jr. et al. |
| 2003/0118865 | A1 * | 6/2003 | Marks et al. .................. 428/690 |
| 2003/0190764 | A1 | 10/2003 | Lee et al. |

FOREIGN PATENT DOCUMENTS

| CN | 1453885 A | 11/2003 |
| JP | 10-341039 | 12/1998 |
| JP | 2000-58911 | 2/2000 |
| JP | 2000-164928 | * 6/2000 |
| JP | 2000-256061 A | 9/2000 |

OTHER PUBLICATIONS

Korean Office Action dated Sep. 30, 2005.
Korean Office Action dated Mar. 24, 2006.

(Continued)

*Primary Examiner*—Thien F Tran
(74) *Attorney, Agent, or Firm*—Buchanan Ingersoll & Rooney PC

(57) ABSTRACT

Provided are a nitride-based light-emitting device including a transparent electrode made of a transparent conductive oxide having a higher work function than indium tin oxide and a method of manufacturing the same. The nitride-based light-emitting device has a sequentially stacked structure of a substrate, an n-type clad layer, an active layer, a p-type clad layer, and an ohmic contact layer. The ohmic contact layer is formed as a film made of a transparent conductive oxide having a higher work function than indium tin oxide or as a film made of the transparent conductive oxide doped with a metal dopant. Therefore, ohmic contact characteristics with the p-type clad layer are enhanced, thereby ensuring excellent current-voltage characteristics. Furthermore, the high light transmittance of the transparent electrode can increase the emission efficiency of the device.

8 Claims, 4 Drawing Sheets

OTHER PUBLICATIONS

European Search Report issued by the European Patent Office on Nov. 16, 2006, in corresponding European Application No. 04256922.8, The Hague, The Netherlands (in English).

Minami, Tadatsugu, et al., "*Work function of transparent conducting multicomponent oxide thin films prepared by magnetron sputtering*", Surface and Coatings Technology, 1988, pp. 583-587, vol. 108, No. 109, Elsevier, Amsterdam, NL.

Phillips, Julia M., et al., "*Zinc-indium-oxide: A high conductivity transparent conducting oxide*", Applied Physics Letters, Oct. 9, 1995, pp. 2246-2248, vol. 67, No. 15, American Institute of Physics, Melville, NY, US.

* cited by examiner

NITRIDE-BASED LIGHT-EMITTING DEVICE

BACKGROUND OF THE INVENTION

This application claims priority from Korean Patent Application No. 2003-80719, filed on Nov. 14, 2003, in the Korean Intellectual Property Office, the disclosure of which is incorporated herein in its entirety by reference.

FIELD OF THE INVENTION

The present invention relates to a nitride-based light-emitting device and a method of manufacturing the same. More particularly, the present invention relates to a nitride-based light-emitting device including a transparent electrode made of a transparent conductive oxide having a higher work function than indium tin oxide (ITO) and a method of manufacturing the same.

DESCRIPTION OF THE RELATED ART

Transparent conductive oxide films have been currently widely applied in the fields of optoelectronics, displays, and energy industries. In particular, in the light-emitting device field, studies about transparent conductive film electrodes that serve to facilitate hole injection and light emission have been actively made by numerous domestic or foreign academic, industrial, and governmental research institutes.

Among transparent conductive oxides, indium oxide ($In_2O_3$), tin oxide ($SnO_2$), and indium tin oxide (ITO) have been the most actively studied and developed. However, these materials have a relatively low work function, and thus, their application as transparent electrodes of gallium nitride-based light-emitting diodes may cause the following problems.

First, since the above-described transparent conductive oxides have a low work function, relative to p-type gallium nitride, a high current flow barrier is formed, which renders a smooth hole injection difficult. Therefore, realization of devices with high emission efficiency may be difficult.

Second, since the above-described transparent conductive oxides have a low transmittance for a blue light beam among light beams emitted from gallium nitride-based light-emitting diodes, it is difficult to apply them to devices emitting a short wavelength light such as blue light.

Meanwhile, to realize light-emitting devices such as light-emitting diodes or laser diodes using a nitride (e.g., gallium nitride)—based semiconductor, an ohmic contact between the semiconductor and an electrode is very important.

Such gallium nitride-based light-emitting devices are classified into top-emitting light-emitting diodes (TLEDs) and flip-chip light-emitting diodes (FCLEDs).

In currently widely used TLEDs, light is emitted from an ohmic contact layer that contacts with a p-type clad layer. Such TLEDs require a high quality ohmic contact layer due to low hole density of the p-type clad layer. In this respect, it is required that the ohmic contact layer is formed as a low resistance and high transmittance layer to compensate for low electroconductivity, thereby facilitating hole injection and light emission.

Generally, such TLEDs have a sequentially stacked structure of a nickel (Ni) layer and a gold (Au) layer on the p-type clad layer.

The Ni/Au layer has a good specific-contact resistance of $10^{-3}$ to $10^{-4}$ $\Omega cm^2$ and is used as a semi-transparent ohmic contact layer.

When the Ni/Au layer is annealed at a temperature of 500 to 600° C. and under an oxygen atmosphere, nickel oxide (NiO) which is a p-type semiconductor oxide is generated at the interface between the p-type clad layer made of gallium nitride and the Ni/Au layer used as the ohmic contact layer. Therefore, a Schottky barrier height (SBH) is decreased and supply of holes, which are the majority carriers, to a surface of the p-type clad layer is facilitated.

According to a general understanding, when the Ni/Au layer is formed on the p-type clad layer and annealed, the concentration of effective carriers on a surface of the p-type clad layer reaches $10^{18}$ or more by reactivation that increases the concentration of a magnesium dopant on the p-type clad layer by removal of an Mg—H intermetallic compound. Therefore, tunneling conduction occurs between the p-type clad layer and the ohmic contact layer, which shows ohmic conduction characteristics of low specific-contact resistance.

However, TLEDs using a semi-transparent film electrode made of Ni/Au have low emission efficiency due to presence of Au with poor light transmittance, which limits realization of next generation, large capacity and high brightness light-emitting devices.

With respect to FCLEDs that emit light from a transparent sapphire substrate using a reflective layer that serves to increase emission efficiency of heat generated during driving and light emission efficiency, there also arise many problems such as high resistance due to oxidation and poor adhesion of the reflective layer.

In view of the above-described limitations of such TLEDs and FCLEDs, there was suggested a p-type ohmic contact layer made of a transparent conductive oxide, for example ITO, which has an excellent light transmittance relative to semi-transparent Ni/Au used for a conventional p-type ohmic contact layer. The ITO ohmic contact layer can increase the output of light-emitting devices but exhibits a relatively high driving voltage. Therefore, the ITO ohmic contact layer has many limitations on its application to large area and capacity, high brightness light-emitting devices.

SUMMARY OF THE INVENTION

The present invention provides a nitride-based light-emitting device including a transparent electrode that has a relatively high work function and can provide a low specific-contact resistance and a high light transmittance, and a method of manufacturing the same.

According to an aspect of the present invention, there is provided a nitride-based light-emitting device including an active layer between an n-type clad layer and a p-type clad layer, wherein an ohmic contact layer made of a transparent conductive oxide is formed on the p-type clad layer, and the transparent conductive oxide is one selected from the group consisting of a first transparent conductive oxide including gallium, indium, and oxygen as main components, a second transparent conductive oxide including zinc, indium, and oxygen as main components, a third transparent conductive oxide including gallium, indium, tin, and oxygen as main components, and a fourth transparent conductive oxide including zinc, indium, tin, and oxygen as main components.

The ohmic contact layer may include at least one metal as a dopant for the transparent conductive oxide to adjust electrical properties of the ohmic contact layer. The metal used as the dopant is that falling in metal elements of the periodic table of elements.

The dopant may be used in an amount of 0.001 to 20 wt %, based on the transparent conductive oxide.

The nitride-based light-emitting device may further include a reflective layer made of at least one selected from the group consisting of Ag, Al, Zn, Mg, Ru, Ti, Rh, Cr, and Pt, on the ohmic contact layer.

The nitride-based light-emitting device may further include a protective layer made of one selected from the group consisting of at least one element selected from the group consisting of Ni, Pt, Pd, Cu, and Zn; a compound including the at least one element selected from the group consisting of Ni, Pt, Pd, Cu, and Zn; and TiN.

The nitride-based light-emitting device may further include a metal capping layer made of at least one selected from the group consisting of Ni, $Ni_xO_y$, Au, Pt, Pd, Mg, Cu, $Cu_xO_y$, Zn, Ag, Sc, Co, $Co_xO_y$, Rh, Li, Be, Ca, Ru, Re, Ti, Ta, Na, and La, on the ohmic contact layer.

The reflective layer may be formed on the metal capping layer.

The nitride-based light-emitting device may further include a metal interlayer made of at least one selected from the group consisting of Ni, $Ni_xO_y$, Au, Pt, Pd, Mg, Cu, $Cu_xO_y$, Zn, Ag, Sc, Co, $Co_xO_y$, Rh, Li, Be, Ca, Ru, Re, Ti, Ta, Na, and La, between the p-type clad layer and the ohmic contact layer.

According to another aspect of the present invention, there is provided a method of manufacturing a nitride-based light-emitting device having a light-emitting structure including an n-type clad layer, an active layer, and a p-type clad layer sequentially stacked on a substrate, the method including: (a) forming an ohmic contact layer on the p-type clad layer of the light-emitting structure using a transparent conductive oxide and (b) annealing the resultant structure of operation (a), wherein in operation (a), the transparent conductive oxide is one selected from the group consisting of a first transparent conductive oxide including gallium, indium, and oxygen as main components, a second transparent conductive oxide including zinc, indium, and oxygen as main components, a third transparent conductive oxide including gallium, indium, tin, and oxygen as main components, and a fourth transparent conductive oxide including zinc, indium, tin, and oxygen as main components.

The ohmic contact layer may include at least one metal as a dopant for the transparent conductive oxide to adjust electrical properties of the ohmic contact layer.

The method may further include forming a metal capping layer on the ohmic contact layer using at least one selected from the group consisting of Ni, $Ni_xO_y$, Au, Pt, Pd, Mg, Cu, $Cu_xO_y$, Zn, Ag, Sc, Co, $Co_xO_y$, Rh, Li, Be, Ca, Ru, Re, Ti, Ta, Na, and La.

The method may further include forming a reflective layer on the ohmic contact layer using at least one selected from the group consisting of Ag, Al, Zn, Mg, Ru, Ti, Rh, Cr, and Pt.

The method may further include forming a protective layer on the reflective layer using one selected from the group consisting of at least one element selected from the group consisting of Ni, Pt, Pd, Cu, and Zn; a compound including the at least one element selected from the group consisting of Ni, Pt, Pd, Cu, and Zn; and TiN.

The method may further include forming a metal interlayer between the p-type clad layer and the ohmic contact layer using at least one selected from the group consisting of Ni, $Ni_xO_y$, Au, Pt, Pd, Mg, Cu, $Cu_xO_y$, Zn, Ag, Sc, Co, $Co_xO_y$, Rh, Li, Be, Ca, Ru, Re, Ti, Ta, Na, and La.

The annealing of operation (b) may be performed at 100 to 800° C. for 10 seconds to 3 hours.

The annealing of operation (b) may be performed in a reactor including the resultant structure of operation (a) under a gas atmosphere including at least one selected from nitrogen, argon, helium, oxygen, hydrogen, and air.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1:
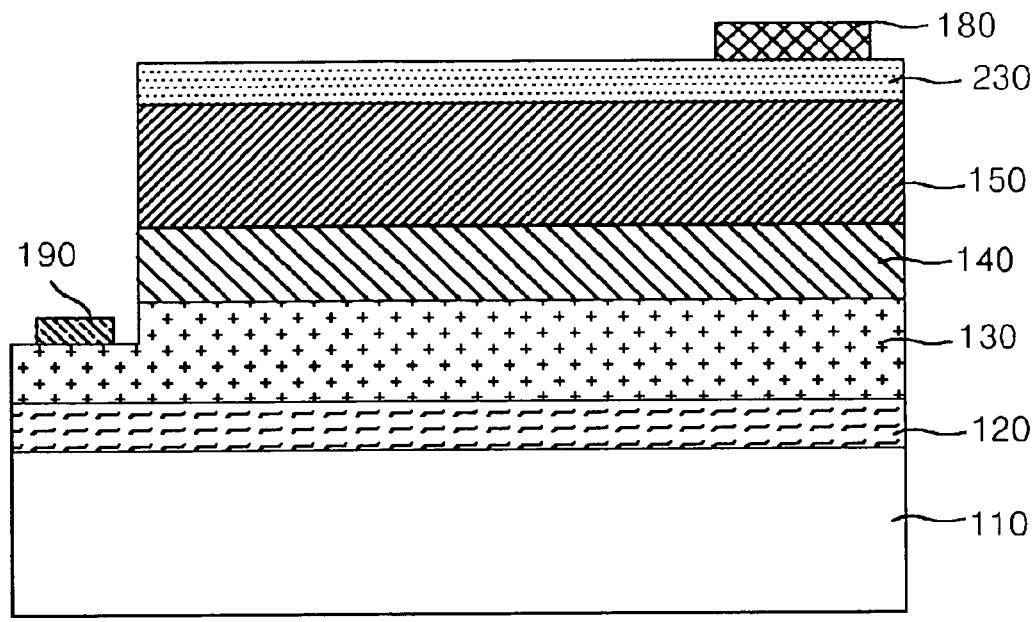
FIG. 1 is a sectional view that illustrates a light-emitting device including a p-type electrode structure according to a first embodiment of the present invention.

Hereinafter, nitride-based light-emitting devices and methods of manufacturing the same according to exemplary embodiments of the present invention will be described in detail with reference to the accompanying drawings.

The same reference numerals refer to the same constitutional elements throughout the specification.

FIG. 1 is a sectional view that illustrates a light-emitting device including a p-type electrode structure according to a first embodiment of the present invention.

Referring to FIG. 1, the light-emitting device of the first embodiment of the present invention has a sequentially stacked structure of a substrate 110, a buffer layer 120, an n-type clad layer 130, an active layer 140, a p-type clad layer 150, and an ohmic contact layer 230. A reference numeral 180 is a p-type electrode pad and a reference numeral 190 is an n-type electrode pad.

A structure ranging from the substrate 110 to the p-type clad layer 150 corresponds to a light-emitting structure and a structure formed on the p-type clad layer 150 corresponds to a p-type electrode structure.

Preferably, the substrate 110 is made of one selected from sapphire ($Al_2O_3$), silicon carbide (SiC), silicon (Si), and gallium arsenic (GaAs).

The buffer layer 120 may be omitted.

The buffer layer 120 through the p-type clad layer 150 are essentially made of a Group III nitride-based compound represented by the formula $Al_xIn_yGa_zN$ ($0 \leq x \leq 1$, $0 \leq y \leq 1$, $0 \leq z \leq 1$, $0 \leq x+y+z \leq 1$). The n-type clad layer 130 and the p-type clad layer 150 may include an appropriate dopant.

The active layer 140 may be formed as one of known various structures such as a monolayer or a multiple quantum well (MQW) layer.

For example, in the case of using a GaN compound, the buffer layer 120 is made of GaN, the n-type clad layer 130 is made of GaN doped with an n-type dopant such as Si, Ge, Se, and Te, the active layer 140 is made of InGaN/GaN MQW or AlGaN/GaN MQW, and the p-type clad layer 150 is made of GaN doped with a p-type dopant such as Mg, Zn, Ca, Sr, and Ba.

An n-type ohmic contact layer (not shown) may be interposed between the n-type clad layer 130 and the n-type electrode pad 190. The n-type ohmic contact layer may be formed as one of known various structures such as a sequentially stacked structure of titanium (Ti) and aluminum (Al).

The p-type electrode pad 180 may have a sequentially stacked structure of nickel (Ni)/gold (Au) or silver (Ag)/Au.

The above-described layers may be formed by e-beam evaporation, PVD (physical vapor deposition), CVD (chemical vapor deposition), PLD (plasma laser deposition), dual-type thermal evaporation, sputtering, or the like.

The ohmic contact layer 230 is used as a p-type electrode structure and is made of a transparent conductive oxide having a higher work function than 4.7 eV which is the work function of ITO.

Preferably, the transparent conductive oxide satisfying this requirement is one of first through fourth transparent conductive oxides as will be described later.

The first transparent conductive oxide has a work function of 5.1 eV and includes gallium (Ga)—indium (In)—oxygen (O) as main components.

The second transparent conductive oxide has a work function of 5.1 eV and includes zinc (Zn)—indium (In)—oxygen (O) as main components.

The third transparent conductive oxide has a work function of 5.4 eV and includes gallium (Ga)—indium (In)—tin (Sn)—oxygen (O) as main components.

The fourth transparent conductive oxide has a work function of 6.1 eV and includes zinc (Zn)—indium (In)—tin (Sn)—oxygen (O) as main components.

There are no particular limitations on ratios of the main components constituting the first through fourth transparent conductive oxides.

Preferably, the ohmic contact layer 230 may include at least one metal of the periodic table of elements as a dopant for the transparent conductive oxide to easily form a good ohmic contact with p-type gallium nitride.

The dopant is used in an amount of 0.01 to 20 wt %, based on the transparent conductive oxide, to allows the ohmic contact layer 230 to have an appropriate electrical property. Here, the term "wt %" indicates a weight ratio of added components.

Preferably, the ohmic contact layer 230 has a thickness of 1 to 1,000 nm.

Preferably, the ohmic contact layer 230 is formed by depositing the above-described materials as starting materials using e-beam evaporation, thermal evaporation, sputtering deposition, or pulsed laser deposition.

The ohmic contact layer 230 is formed at a deposition temperature of 20 to 1,500° C. under a deposition pressure of atmospheric pressure to $10^{-12}$ torr.

After forming the ohmic contact layer 230, annealing is performed.

The annealing is performed in a reactor of 100 to 800° C. under vacuum or gas atmosphere for 10 seconds to 3 hours.

A gas to be supplied to the reactor during the annealing may be at least one selected from nitrogen, argon, helium, oxygen, hydrogen, and air.

Figure 2:
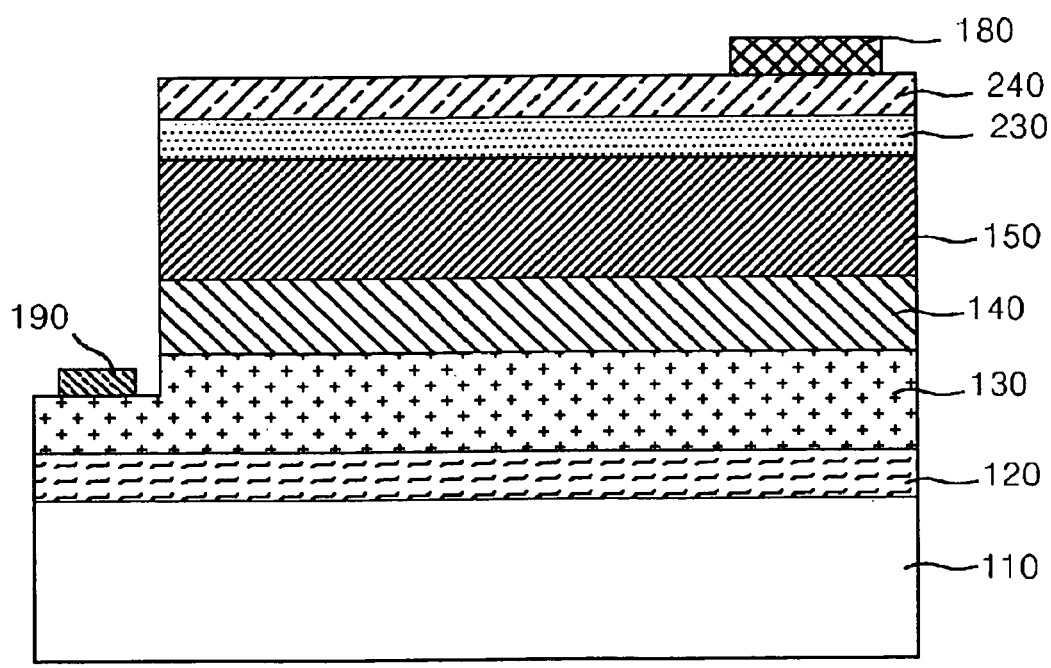
FIG. 2 is a sectional view that illustrates a light-emitting device including a p-type electrode structure according to a second embodiment of the present invention.

FIG. 2 is a sectional view that illustrates a light-emitting device including a p-type electrode structure according to a second embodiment of the present invention.

Referring to FIG. 2, the light-emitting device of the second embodiment of the present invention further includes a metal capping layer 240 on the ohmic contact layer 230, as compared to the light-emitting device of the first embodiment of the present invention.

Here, a p-type electrode structure includes the ohmic contact layer 230 and the metal capping layer 240.

The metal capping layer 240 is made of a material that can adjust electrical properties (e.g., sheet resistance) of the transparent conductive oxide constituting the ohmic contact layer 230.

That is, the metal capping layer 240 is made of a material that can form another transparent conductive oxide and facilitate formation of gallide, which is a gallium-based compound, by annealing after deposition, to thereby increase an effective carrier (hole) concentration of a top gallium nitride layer.

A material for the metal capping layer 240 satisfying the above-described requirements is at least one selected from the group consisting of Ni, $Ni_xO_y$, Au, Pt, Pd, Mg, Cu, $Cu_xO_y$, Zn, Ag, Sc, Co, $Co_xO_y$, Rh, Li, Be, Ca, Ru, Re, Ti, Ta, Na, and La.

The metal capping layer 240 has a thickness of 1 to 1,000 nm.

Figure 3:
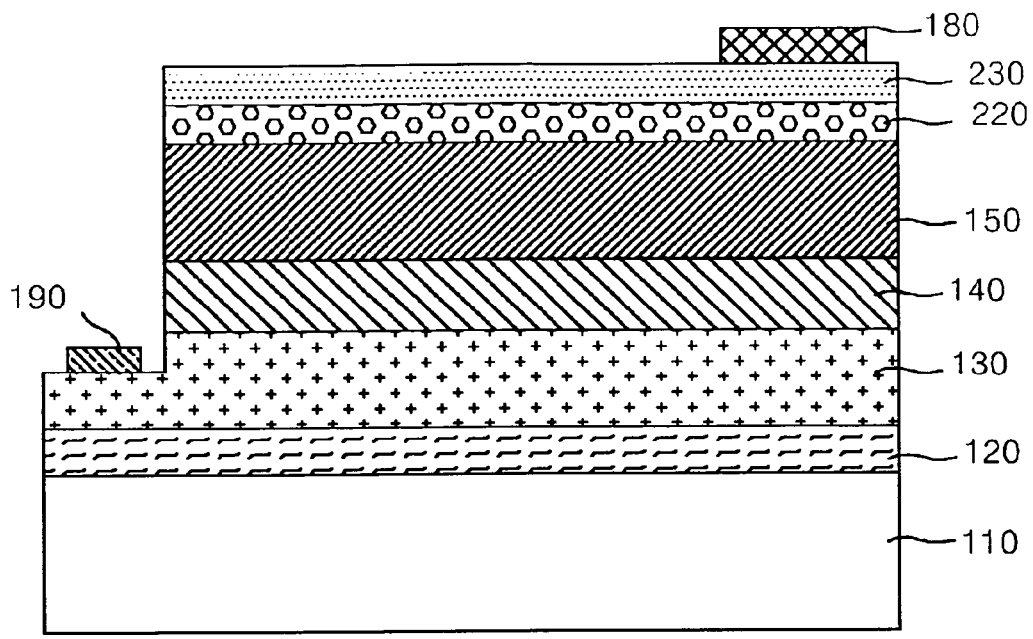
FIG. 3 is a sectional view that illustrates a light-emitting device including a p-type electrode structure according to a third embodiment of the present invention.

FIG. 3 is a sectional view that illustrates a light-emitting device including a p-type electrode structure according to a third embodiment of the present invention.

Referring to FIG. 3, the light-emitting device of the third embodiment of the present invention further includes a metal interlayer 220 between the ohmic contact layer 230 and the p-type clad layer 150, as compared to the light-emitting device of the first embodiment of the present invention.

Here, a p-type electrode structure includes the metal interlayer 220 and the ohmic contact layer 230.

Preferably, like the above-described metal capping layer 240, the metal interlayer 220 is made of a material that can form another transparent conductive oxide and facilitate formation of gallide which is a gallium-based compound by annealing after deposition to thereby increase an effective carrier (hole) concentration of a top gallium nitride layer.

A material for the metal interlayer 220 satisfying the above-described requirements is one selected from the group consisting of Ni, $Ni_xO_y$, Au, Pt, Pd, Mg, Cu, $Cu_xO_y$, Zn, Ag, Sc, Co, $Co_xO_y$, Rh, Li, Be, Ca, Ru, Re, Ti, Ta, Na, and La; an alloy or a solid solution of two or more of the forgoing elements; or an oxide of one or more of the forgoing elements.

The metal interlayer 220 can adjust a carrier concentration of the ohmic contact layer 230 and the p-type clad layer 150, and at the same time, can form another transparent conductive oxide and gallide which is a gallium-based compound by annealing. Therefore, a better ohmic contact with the p-type clad layer 150 can be accomplished.

Preferably, the metal interlayer 220 has a thickness of 1 to 1,000 nm.

Figure 4:
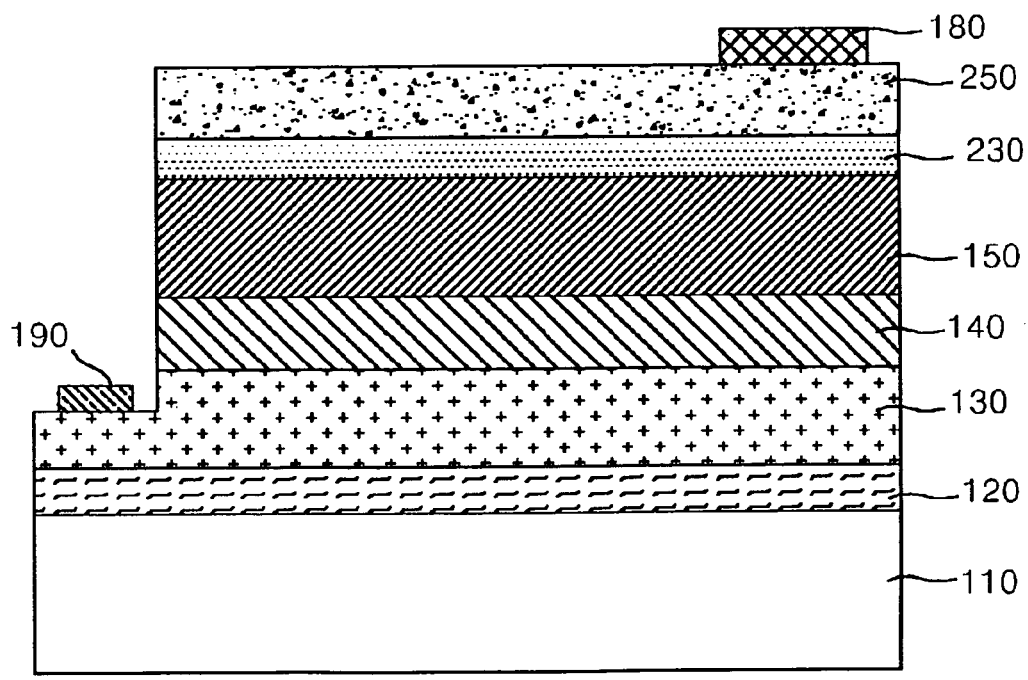
FIG. 4 is a sectional view that illustrates a light-emitting device including a p-type electrode structure according to a fourth embodiment of the present invention.

FIG. 4 is a sectional view that illustrates a light-emitting device including a p-type electrode structure according to a fourth embodiment of the present invention.

Referring to FIG. 4, the light-emitting device of the fourth embodiment of the present invention includes a reflective layer 250 on the ohmic contact layer 230.

Here, a p-type electrode structure includes the ohmic contact layer 230 and the reflective layer 250.

The reflective layer 250 is used to embody a flip-chip light-emitting device and may be made of at least one selected from the group consisting of Ag, Al, Zn, Mg, Ru, Ti, Rh, Cr, and Pt.

The reflective layer 250 has a thickness of 10 to 2,000 nm.

The reflective layer 250 may also be added to the light-emitting devices as shown in FIGS. 2 and 3. That is, in the light-emitting device of FIG. 2, the reflective layer 250 may be formed on the metal capping layer 240 using the above-described material. In the light-emitting device of FIG. 3, the reflective layer 250 may be formed on the ohmic contact layer 230 using the above-described material.

Figure 5:
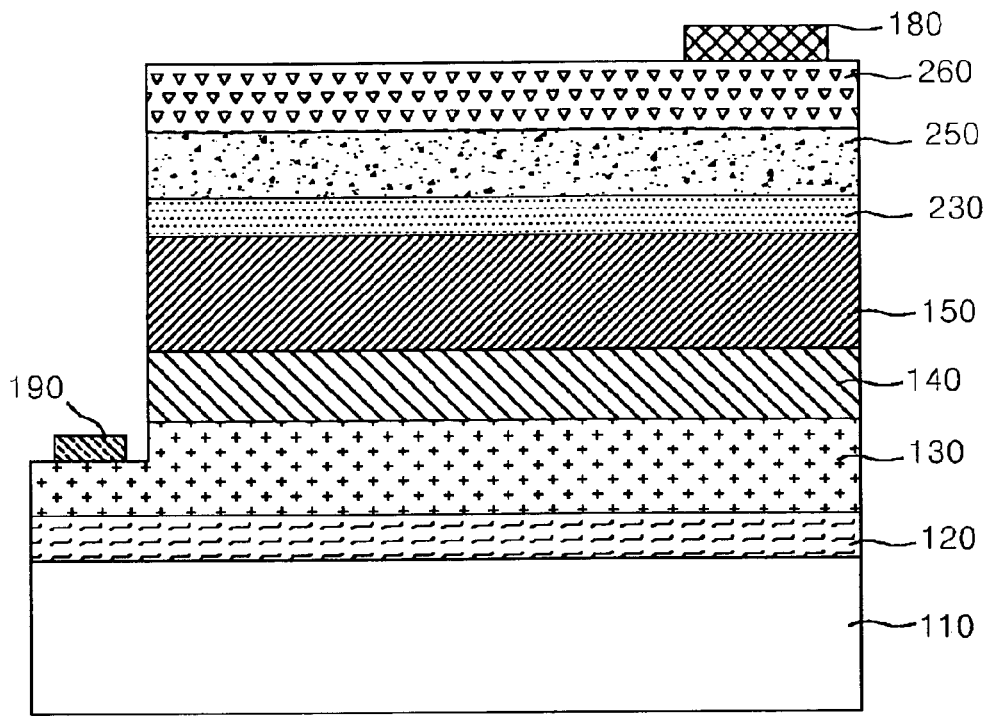
FIG. 5 is a sectional view that illustrates a light-emitting device including a p-type electrode structure according to a fifth embodiment of the present invention.

FIG. 5 is a sectional view that illustrates a light-emitting device including a p-type electrode structure according to a fifth embodiment of the present invention.

Referring to FIG. 5, the light-emitting device of the fifth embodiment of the present invention has a sequentially stacked structure of the reflective layer 250 and a protective layer 260 on the ohmic contact layer 230.

The protective layer 260 serves to increase adhesion with the p-type electrode pad 180 and increase durability by oxidation prevention of the reflective layer 250 in a flip-chip light-emitting device structure.

The protective layer 260 is made of one selected from the group consisting of at least one element selected from the group consisting of Au, Ni, Pt, Pd, Cu, and Zn; a compound including the at least one selected from the group consisting of Au, Ni, Pt, Pd, Cu, and Zn; and TiN.

Figure 6:
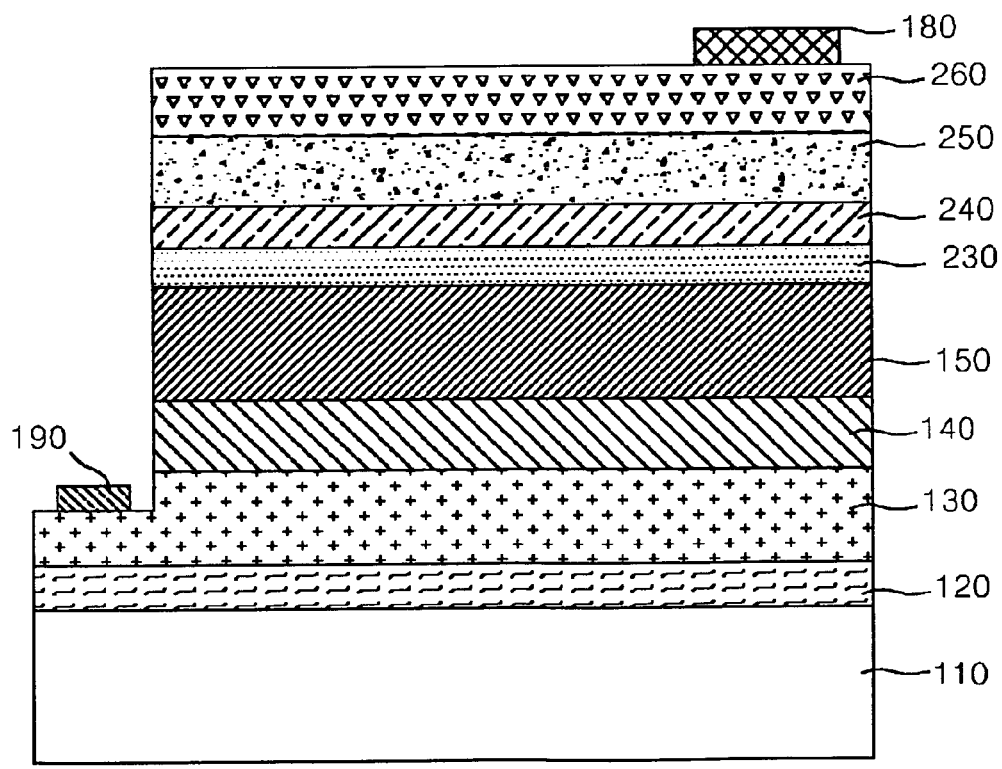
FIG. 6 is a sectional view that illustrates a light-emitting device including a p-type electrode structure according to a sixth embodiment of the present invention.

FIG. 6 is a sectional view that illustrates a light-emitting device including a p-type electrode structure according to a sixth embodiment of the present invention.

Referring to FIG. 6, the light-emitting device of the sixth embodiment of the present invention has a sequentially stacked structure of the metal capping layer 240, the reflective layer 250, and the protective layer 260, on the ohmic contact layer 230.

Here, a p-type electrode structure includes the ohmic contact layer 230, the metal capping layer 240, the reflective layer 250, and the protective layer 260.

The layers as shown in FIG. 6 are made of the above-described materials.

Figure 7:
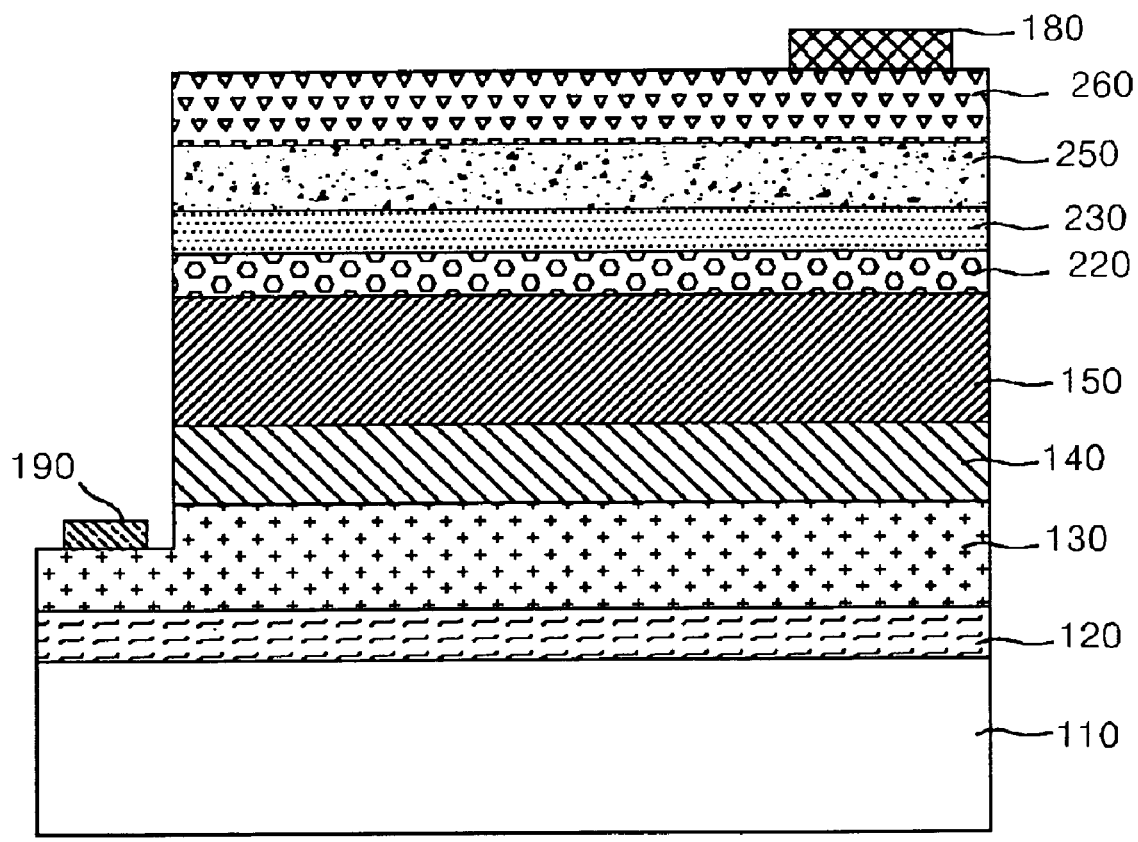
FIG. 7 is a sectional view that illustrates a light-emitting device including a p-type electrode structure according to a seventh embodiment of the present invention.

FIG. 7 is a sectional view that illustrates a light-emitting device including a p-type electrode structure according to a seventh embodiment of the present invention.

Referring to FIG. 7, the light-emitting device of the seventh embodiment of the present invention further includes the reflective layer 250 and the protective layer 260, as compared with the light-emitting device of FIG. 3.

The layers as shown in FIG. 7 are made of the above-described materials.

Meanwhile, the light-emitting devices described with reference to FIGS. 1 through 7 are manufactured by sequentially depositing corresponding layers of a p-type structure on a light-emitting structure ranging from the substrate 110 through the p-type clad layer 150 using a deposition method as described above with reference to FIG. 1 followed by annealing.

By the annealing, the light-emitting devices can have enhanced current-voltage characteristics.

As apparent from the above description, according to a nitride-based light-emitting device and a method of manufacturing the same according to the present invention, use of a transparent conductive film electrode layer with a relatively high work function enhances ohmic contact characteristics with a p-type clad layer, thereby ensuring excellent current-voltage characteristics. Furthermore, the high light transmittance of the transparent conductive film electrode layer can increase the emission efficiency of the device.

What is claimed is:

1. A nitride-based light-emitting device comprising an active layer between an n-type clad layer and a p-type clad layer,
   wherein an ohmic contact layer made of a transparent conductive oxide is formed on the p-type clad layer, and
   the transparent conductive oxide is one selected from the group consisting of a first transparent conductive oxide comprising gallium, indium, and oxygen as main components, a second transparent conductive oxide comprising zinc, indium, and oxygen as main components, a third transparent conductive oxide comprising gallium, indium, tin, and oxygen as main components, and a fourth transparent conductive oxide comprising zinc, indium, tin, and oxygen as main components, and
   further comprising a reflective layer made of at least one selected from the group consisting of Ag, Al, Zn, Mg, Ru, Rh, and Cr, on the ohmic contact layer.

2. The nitride-based light-emitting device of claim 1, further comprising a protective layer made of one selected from the group consisting of at least one element selected from the group consisting of Ni, Pt, Pd, Cu, and Zn; a compound comprising the at least one element selected from the group consisting of Ni, Pt, Pd, Cu, and Zn; and TiN.

3. The nitride-based light-emitting device of claim 2, further comprising a metal interlayer made of at least one selected from the group consisting of Ni, $Ni_xO_y$, Au, Pt, Pd, Mg, Cu, $Cu_xO_y$, Zn, Ag, Sc, Co, $Co_xO_y$, Rh, Li, Be, Ca, Ru, Re, Ti, Ta, Na, and La, between the p-type clad layer and the ohmic contact layer.

4. The nitride-based light-emitting device of claim 1, further comprising a metal interlayer made of at least one selected from the group consisting of Ni, $Ni_xO_y$, Au, Pt, Pd, Mg, Cu, $Cu_xO_y$, Zn, Ag, Sc, Co, $Co_xO_y$, Rh, Li, Be, Ca, Ru, Re, Ti, Ta, Na, and La, between the p-type clad layer and the ohmic contact layer.

5. A nitride-based light-emitting device comprising an active layer between an n-type clad layer and a p-type clad layer,
   wherein an ohmic contact layer made of a transparent conductive oxide is formed on the p-type clad layer,
   the transparent conductive oxide is one selected from the group consisting of a first transparent conductive oxide comprising gallium, indium, and oxygen as main components, a second transparent conductive oxide comprising gallium, indium, tin, and oxygen as main components, and a third transparent conductive oxide comprising zinc, indium, tin, and oxygen as main components, and
   further comprising a metal interlayer made of at least one selected from the group consisting of $Ni_xO_y$, Pt, Pd, Mg, Cu, $Cu_xO_y$, Zn, Sc, Co, $Co_xO_y$, Rh, Li, Be, Ca, Ru, Re, Ti, Ta, Na, and La, between the p-type clad layer and the ohmic contact layer.

6. A nitride-based light-emitting device comprising an active layer between an n-type clad layer and a p-type clad layer, wherein:
   an ohmic contact layer made of a transparent conductive oxide is formed on the p-type clad layer,
   the transparent conductive oxide is one selected from the group consisting of a first transparent conductive oxide comprising gallium, indium, and oxygen as main components, a second transparent conductive oxide comprising gallium, indium, tin, and oxygen as main components, and a third transparent conductive oxide comprising zinc, indium, tin, and oxygen as main components, and further comprising a reflective layer made of at least one selected from the group consisting of Ag, Al, Zn, Mg, Ru, Rh, and Cr on the ohmic contact layer.

7. The nitride-based light-emitting device of claim 6, further comprising a protective layer made of one selected from the group consisting of at least one element selected from the group consisting of Ni, Pt, Pd, Cu, and Zn; a compound comprising the at least one element selected from the group consisting of Ni, Pt, Pd, Cu, and Zn; and TiN.

8. The nitride-based light-emitting device of claim 6, further comprising a metal interlayer made of at least one selected from the group consisting of Ni, $Ni_xO_y$, Au, Pt, Pd, Mg, Cu, $Cu_xO_y$, Zn, Ag, Sc, Co, $Co_xO_y$, Rh, Li, Be, Ca, Ru, Re, Ti, Ta, Na, and La, between the p-type clad layer and the ohmic contact layer.

* * * * *